(12) United States Patent
Conley et al.

(10) Patent No.: US 11,747,739 B2
(45) Date of Patent: Sep. 5, 2023

(54) METHOD AND APPARATUS FOR IMAGING USING NARROWED BANDWIDTH

(71) Applicants: ASML Netherlands B. V., Veldhoven (NL); Cymer, LLC, San Diego, CA (US)

(72) Inventors: Willard Earl Conley, San Diego, CA (US); Joshua Jon Thornes, San Diego, CA (US); Duan-Fu Stephen Hsu, Fremont, CA (US)

(73) Assignees: ASML NETHERLANDS, Veldhoven (NL); CYMER, LLC, San Diego, CA (US)

( * ) Notice: Subject to any disclaimer, the term of this patent is extended or adjusted under 35 U.S.C. 154(b) by 0 days.

(21) Appl. No.: 17/434,802

(22) PCT Filed: Feb. 10, 2020

(86) PCT No.: PCT/EP2020/053252
§ 371 (c)(1),
(2) Date: Aug. 30, 2021

(87) PCT Pub. No.: WO2020/177979
PCT Pub. Date: Sep. 10, 2020

(65) Prior Publication Data
US 2022/0163899 A1 May 26, 2022

Related U.S. Application Data

(60) Provisional application No. 62/813,079, filed on Mar. 3, 2019.

(51) Int. Cl.
G03F 7/20 (2006.01)
G03F 7/00 (2006.01)

(52) U.S. Cl.
CPC .......... *G03F 7/70575* (2013.01); *G03F 7/705* (2013.01)

(58) Field of Classification Search
CPC ..... G03F 7/705; G03F 7/70575; A61H 1/024; A61H 1/0244; A61H 2201/0192;
(Continued)

(56) References Cited

U.S. PATENT DOCUMENTS

| 4,937,619 A | 6/1990 | Fukuda et al. |
| 5,229,872 A | 7/1993 | Mumola |

(Continued)

FOREIGN PATENT DOCUMENTS

| CN | 105229535 | 1/2016 |
| TW | 201732419 | 9/2017 |
| WO | 2020078844 | 4/2020 |

OTHER PUBLICATIONS

International Search Report and Written Opinion issued in corresponding PCT Patent Application No. PCT/EP2020/053252, dated Jun. 2, 2020.

(Continued)

*Primary Examiner* — Deoram Persaud
(74) *Attorney, Agent, or Firm* — Pillsbury Winthrop Shaw Pittman, LLP

(57) ABSTRACT

Systems, methods, and computer programs for increasing a contrast for a lithography system are disclosed. In one aspect, a method of optimizing a process for imaging a feature on a substrate using a photolithography system is disclosed, the method including obtaining an optical spectrum of a light beam for the imaging, wherein the light beam includes pulses having a plurality of different wavelengths, and narrowing the optical spectrum of the pulses of the light beam for the imaging to improve a quality metric of the imaging.

20 Claims, 17 Drawing Sheets

(58) Field of Classification Search
CPC ........ A61H 2201/12; A61H 2201/1628; A61H 2201/164; A61H 2201/165; A61H 2201/1676; A61H 2201/5007; A61H 2201/5015; A61H 2203/0406; A61H 2205/088; A61H 2205/108; A61H 3/00; F16M 13/04

See application file for complete search history.

(56) References Cited

U.S. PATENT DOCUMENTS

| | | | |
|---|---|---|---|
| 6,046,792 | A | 4/2000 | Van Der Werf et al. |
| 7,088,758 | B2 * | 8/2006 | Sandstrom .............. H01S 3/005 |
| | | | 372/55 |
| 7,587,704 | B2 | 8/2009 | Ye et al. |
| 10,416,566 | B2 | 9/2019 | Conley et al. |
| 2007/0031745 | A1 | 2/2007 | Ye et al. |
| 2007/0050749 | A1 | 3/2007 | Ye et al. |
| 2008/0253413 | A1 | 10/2008 | Partlo |
| 2008/0301620 | A1 | 12/2008 | Ye et al. |
| 2008/0309897 | A1 | 12/2008 | Wong et al. |
| 2009/0157630 | A1 | 6/2009 | Yuan |
| 2010/0162197 | A1 | 6/2010 | Ye et al. |
| 2010/0180251 | A1 | 7/2010 | Ye et al. |
| 2013/0147994 | A1 * | 6/2013 | Gao .................. H04N 9/04517 |
| | | | 348/294 |
| 2016/0070179 | A1 | 3/2016 | Op T Root et al. |
| 2018/0356734 | A1 | 12/2018 | Conley et al. |
| 2022/0390857 | A1 * | 12/2022 | Zhao ..................... H01S 3/1055 |

OTHER PUBLICATIONS

Taiwanese Office Action issued in corresponding Taiwanese Patent Application No. 109106293, dated Nov. 6, 2020.

Kroyan, A. et al: "Modeling the effects of excimer laser bandwidths on lithographic performance", Proc. of SPIE, vol. 4000, pp. 658-664 (2000).

* cited by examiner

METHOD AND APPARATUS FOR IMAGING USING NARROWED BANDWIDTH

CROSS-REFERENCE TO RELATED APPLICATIONS

This application is the U.S. national phase entry of PCT Patent Application No. PCT/EP2020/053252, which was filed on Feb. 10, 2020, which claims the benefit of priority of U.S. patent application No. 62/813,079, which was filed on Mar. 3, 2019, and which is incorporated herein in its entirety by reference.

TECHNICAL FIELD

The description herein relates generally to improving and optimizing lithography processes. More particularly, the disclosure includes apparatus, methods, and computer programs for narrowing a bandwidth of laser light used for imaging to improve contrast.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k_1 \times \lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Systems, methods, and computer programs for improving contrast in an imaging operation are described.

In an embodiment, a method of optimizing a method for imaging a feature on a substrate using a photolithography system includes obtaining an optical spectrum of a light beam for the imaging, wherein the light beam includes pulses having a plurality of different wavelengths, and narrowing the optical spectrum of the pulses of the light beam for the imaging to improve a quality metric of the imaging.

In an embodiment, the method may include obtaining a design for a patterning device configured to produce the feature on the substrate, obtaining a light source design for the imaging, and iteratively varying, concurrently, the optical spectrum of the light beam, the mask design, and the light source design to provide an optimized optical spectrum, an optimized mask design, and an optimized light source design.

In an embodiment, a method of improving contrast in a photolithographic system includes imaging a pattern on a substrate using light having pulses of a plurality of different wavelengths narrowing a bandwidth of the light pulses.

In an embodiment, a method of imaging a feature on a substrate using a photolithography system, includes directing a pulsed light beam along a direction of propagation toward a patterning device, the pulsed light beam comprising a plurality of pulses of light, patterning a set of the pulses of light in the pulsed light beam with the patterning device to produce a patterned beam of light, directing the patterned beam of light toward a substrate during a single exposure pass, generating, during the single exposure pass, at least a first aerial image and a second aerial image on the substrate, the first aerial image being at a first plane on the substrate and the second aerial image being at a second plane on the substrate, the first plane and the second plane being spatially distinct from each other and separated from each other by a separation distance along the direction of propagation, and forming the three-dimensional semiconductor component based on an interaction between light in the first aerial image and a material in a first portion of the substrate and an interaction between light in the second aerial image and a material in a second portion of the substrate, wherein at least one of the pulses in the set of pulses has a first wavelength and at least one of the other pulses in the set of pulses has a second wavelength that is different from the first wavelength, such that the separation distance is formed during the single exposure pass based on the difference between the first wavelength and the second wavelength and wherein a bandwidth of the set of pulses is narrowed.

In an embodiment, a bandwidth of the pulses is between 50 fm and 275 fm.

In an embodiment, the pulsed light beam is generated in a laser having a nominal bandwidth of 300 fm and a line narrowing module of the laser is adjusted to produce the bandwidth of 50 fm to 275 fm.

In an embodiment, the method includes selecting the bandwidth to produce an improvement in a quality metric of the imaging process.

In an embodiment, the quality metric is selected from among contrast, image log slope, exposure latitude, and/or normalized image log slope.

In an embodiment, the method includes, prior to the imaging, optimizing a light source design and/or a mask design based at least in part on the bandwidth of the pulses. The optimizing may include iteratively varying, concurrently, an optical spectrum of the light beam, the mask design, and the light source design to provide an optimized optical spectrum, an optimized mask design, and an optimized light source design.

In an embodiment, a photolithographic system is configured to perform any of the methods described above.

Furthermore, according to an embodiment, there is provided a computer program product comprising a non-transitory computer readable medium having instructions recorded thereon, the instructions when executed by a computer implementing the methods listed above.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
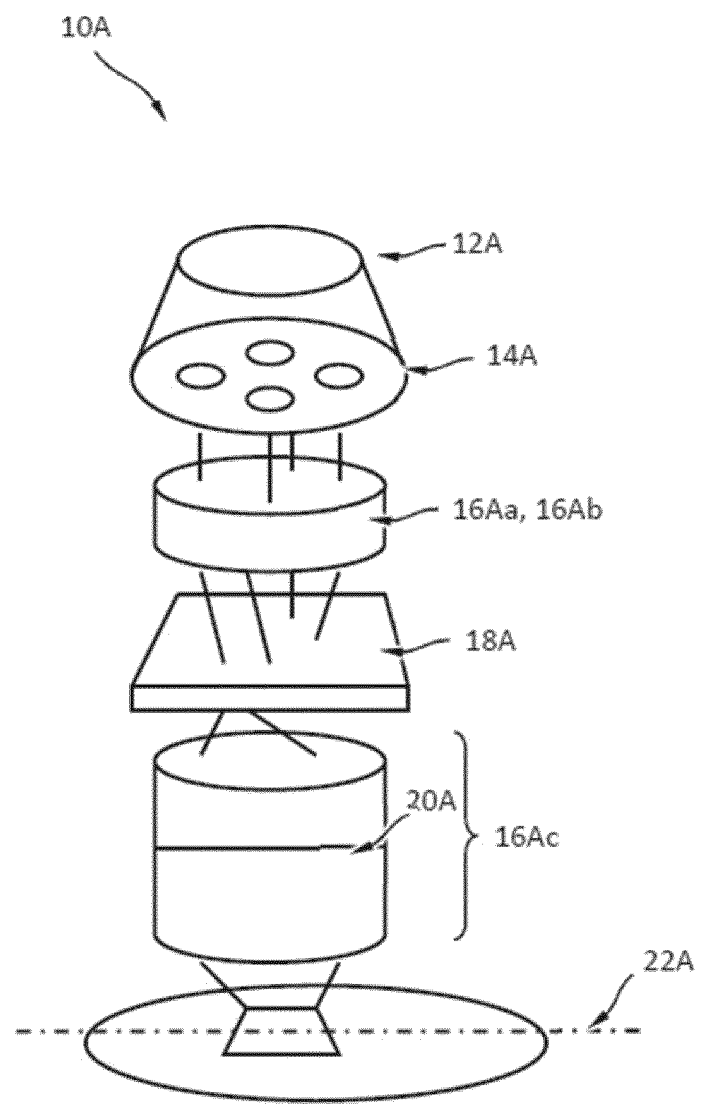
FIG. 1 illustrates a block diagram of various subsystems of a lithographic projection apparatus, according to an embodiment.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
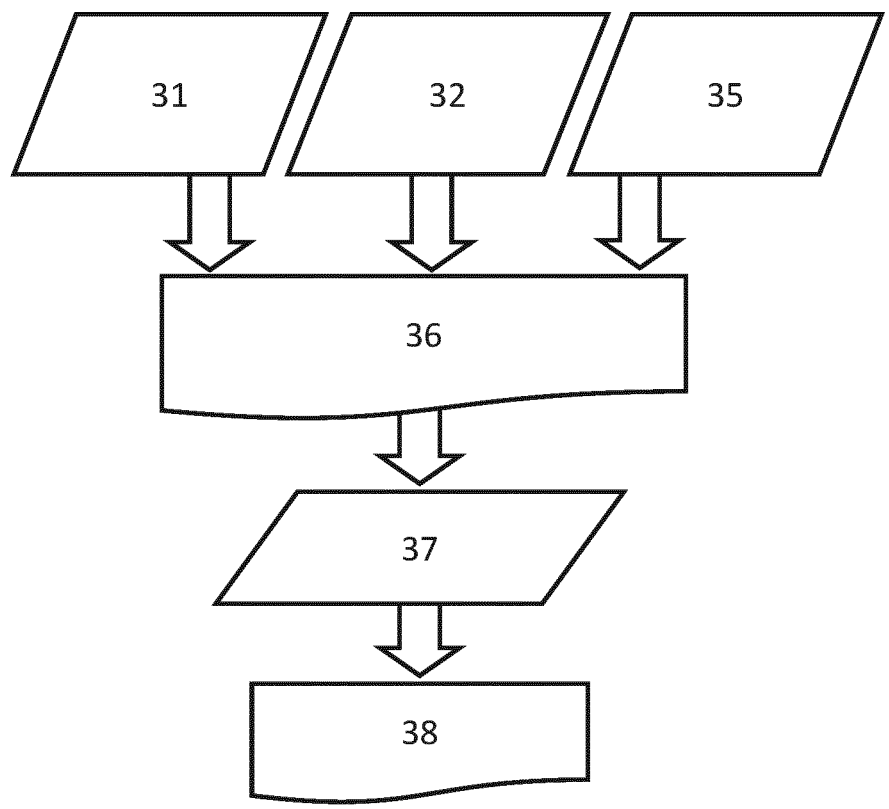
FIG. 2 illustrates an exemplary flow chart for simulating lithography in a lithographic projection apparatus, according to an embodiment.

FIG. 2 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "process model" means a model that includes one or more models that simulate a patterning process. For example, a process model can include any combination of: an optical model (e.g., that models a lens system/projection system used to deliver light in a lithography process and may include modelling the final optical image of light that goes onto a photoresist), a resist model (e.g., that models physical effects of the resist, such as chemical effects due to the light), an optical proximity correction (OPC) model (e.g., that can be used to make masks or reticles and may include sub-resolution resist features (SRAFs), etc.).

As used herein, the term "concurrently," for example when referring to "concurrently varying" means that two or more things are occurring at approximately, but not necessarily exactly, at the same time. For example, varying a pupil design concurrently with a mask pattern can mean making a small modification to a pupil design, then making a small adjustment to a mask pattern, and then another modification to the pupil design, and so on. However, the present disclosure contemplates that in some parallel processing applications, concurrency can refer to operations occurring at the same time, or having some overlapping in time.

By way of introduction, the present disclosure provides systems, methods and computer program products which, among other things, relate to modifying or optimizing features of a lithography system in order to increase performance and manufacturing efficiency. The features that can be modified can include an optical spectrum of light used in the lithography process, a mask, a pupil, etc. Any combination of these features (and possibly others) can be implemented in order to improve, for example, a depth of focus, a process window, a contrast, or the like, of a lithography system. Of particular importance is the fact that, in some embodiments, modification of one feature affects the other features. In this way, to achieve the desired improvements, multiple features can be concurrently modified/varied, as described below.

Figure 3:
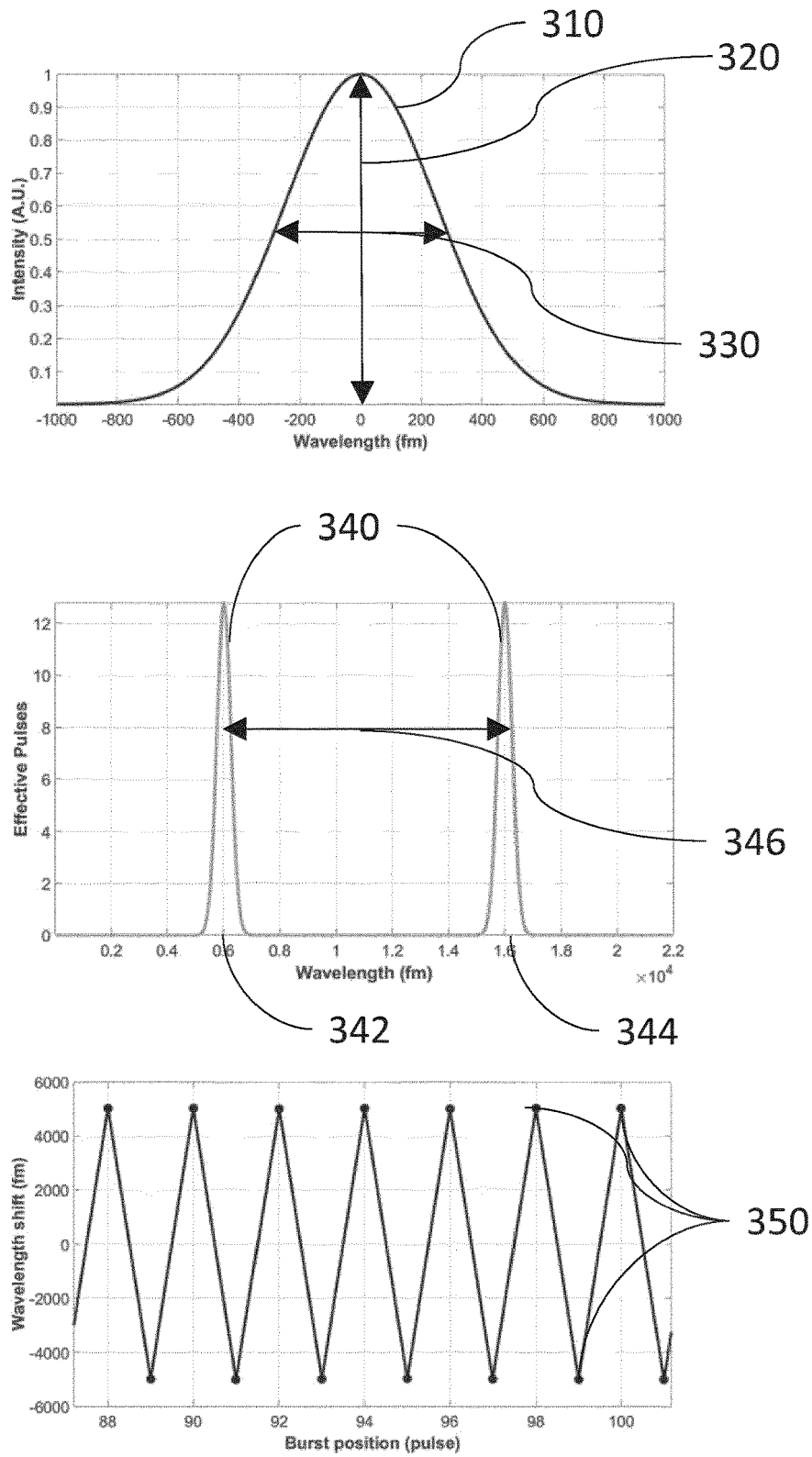
FIG. 3 is a diagram illustrating an exemplary application of multiple light wavelengths, according to an embodiment.

FIG. 3 is a diagram illustrating an exemplary application of multiple light wavelengths, according to an embodiment.

In an embodiment, laser light or plasma emission having a single wavelength of light (i.e., having a central wavelength) can be used for a lithography process. One example of such a single-wavelength optical spectrum 310 is illustrated by the top panel of FIG. 3. Here, we see that a simplified representation of a single wavelength of light can include an amplitude 320, center wavelength, and bandwidth 330 (the shape of optical spectrum 310 is shown relative to the center wavelength, which can be any value). Any of the example light spectra (or portions thereof) described herein can be approximately Lorentzian, Gaussian, or other such profiles representative of light beams.

In another embodiment, light having a multiple-wavelength optical spectrum 340 (also referred to herein as a multi-color optical spectrum) can be used. An example of such is illustrated in FIG. 3 by the middle panel showing two peaks representing two different light beams having first center wavelength 342 and second center wavelength 344 that is different than first center wavelength 342. In this way, the optical spectrum 340 can be a multi-color optical spectrum where the multi-color optical spectrum includes at least two different peaks having peak separation 346. While the light is typically discussed herein as having two central wavelengths, this should not be considered limiting. For example, light having any number of central wavelengths, four, five, ten, etc. can be implemented in a similar manner to that described for the two color light discussed throughout the present disclosure. Similarly, more complicated patterns or waveforms of light can be combined to substantially recreate the desired main light peaks.

The bottom portion of FIG. 3 illustrates that light corresponding to the multi-color spectrum 340 can be from a light source where the multiple colors of light are delivered at different times. For example, the two different wavelengths of light can be delivered in bursts 350 where the center wavelength of light alternates between from burst to burst. In other embodiments, the two wavelengths of light can be delivered substantially simultaneously (e.g., by multiple laser systems or multi-wavelength plasma emission, combining to form a two color light pattern). Delivery of the light can be at any part of the lithography system. In some embodiments, the light can be delivered to components such as lenses or pupils. Also, the light can be delivered to other components such as apertures, masks, reticles, substrates, or the like. One example of an optical path of the light through an example lithography system is illustrated in FIG. 1.

In some embodiments, the light can be delivered with further variations in the center wavelength (beyond just making the spectra "two-color"). This has the effect of "blurring" the light delivered, but also can cause the beneficial effect of increasing the exposure latitude at only a slight cost to the depth of focus. For example, any center wavelengths of the peaks of the optical spectrum can be varied (e.g., increased or decreased) by approximately 1 fm, 10 fm, 50 fm, 100 fm 200 fm, 500 fm, 1000 fm, etc. The variation can be set to a specific value, or can be selected such that the increase in the exposure latitude is maximized relative to the decrease in depth of focus. Also, in some embodiments, the variation can be applied to every other pulse (i.e., alternating), but can also be applied to every third pulse, fourth pulse, etc. In this way, the optical spectrum can be provided in a series of pulses, with a center wavelength in at least one peak in the optical spectrum further varied in every other pulse to shift by approximately 500 fm.

Figure 4:
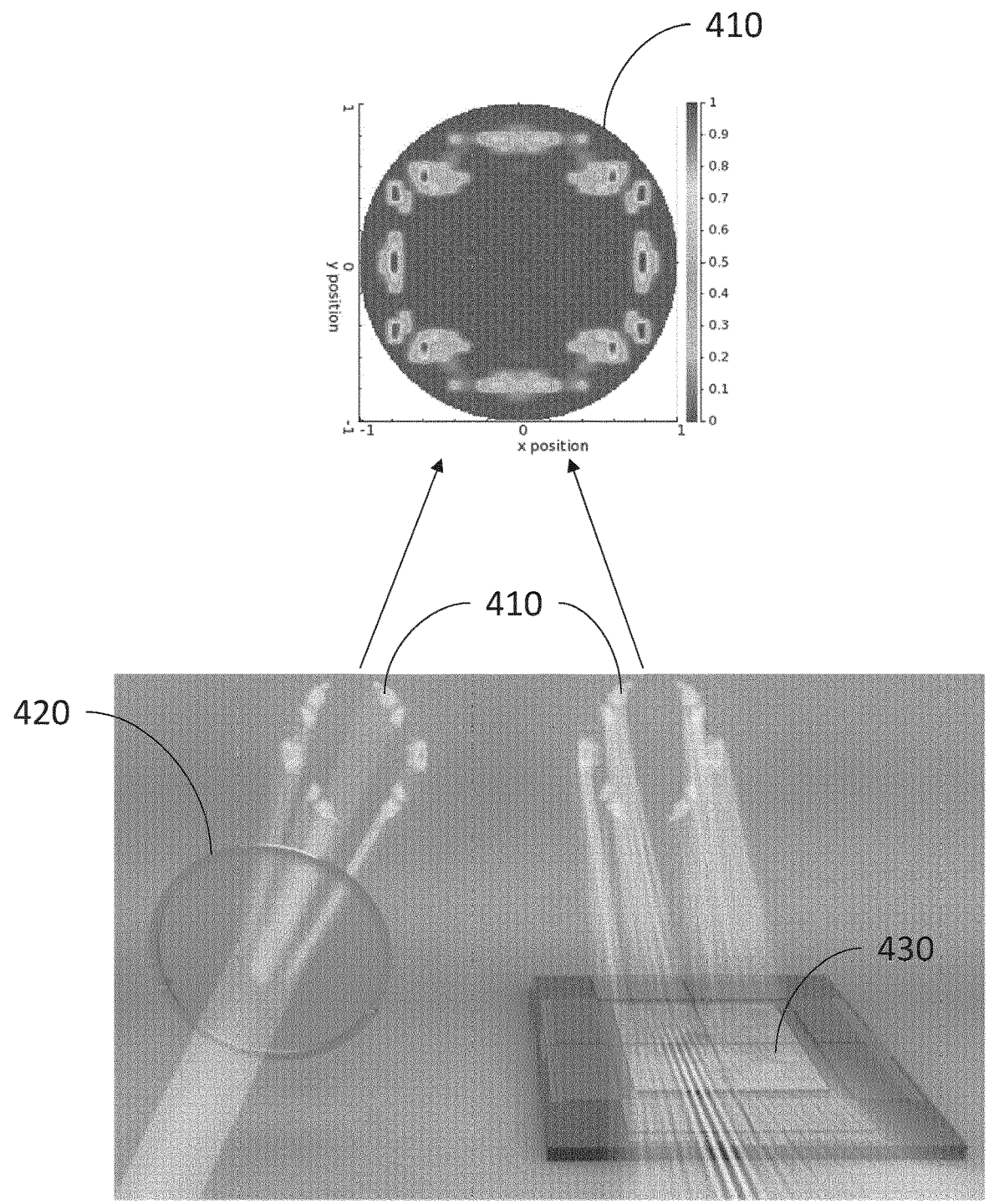
FIG. 4 is a diagram illustrating an exemplary pupil design forming a light pattern, according to an embodiment.

FIG. 4 is a diagram illustrating an exemplary pupil design 410 forming a light pattern, according to an embodiment.

In an embodiment, lithography system can include one or more pupils. As part of a lithography process, the light can be converted into a prescribed pattern (e.g., having a particular spatial distribution of intensity and/or phase) before it passes through the mask. As used herein, the term "pupil design" refers to the pattern of light that is generated by the physical construction or configuration of the pupil. Throughout the present disclosure, pupil designs are referred to with images representing and intensity of light of the pupil design. One example of pupil design 410 is illustrated in the top portion of FIG. 4. Here, the circular region represents light of varying intensity shown by the different colors. Such pupil designs as illustrated herein are intended as examples only and should not be considered limiting in any respect.

In an embodiment, a pupil can be a glass disc, referred to herein as a diffractive optical element (DOE) 420. The material structure of the DOE 420 can cause the light to deflect and combine to form a particular pupil design. Because the pupil design is set by the structure of the DOE 420, each desired pupil design can require a different DOE 420.

In another embodiment, the pupil can be mirror array 430 that is made up of many small mirrors which can be individually controlled to generate the pupil design. Examples of DOE 420 and mirror array 430 are illustrated in the bottom portion of FIG. 4. DOE 420 is shown on the left as receiving a beam of light and then emitting the illustrated pupil design 410. On the right is an example mirror array 430 where light is incident on the collection of mirrors. By a particular configuration of mirror array 430, pupil design 410 can also be formed (shown here as being equivalent to that formed by DOE 420).

Figure 5:
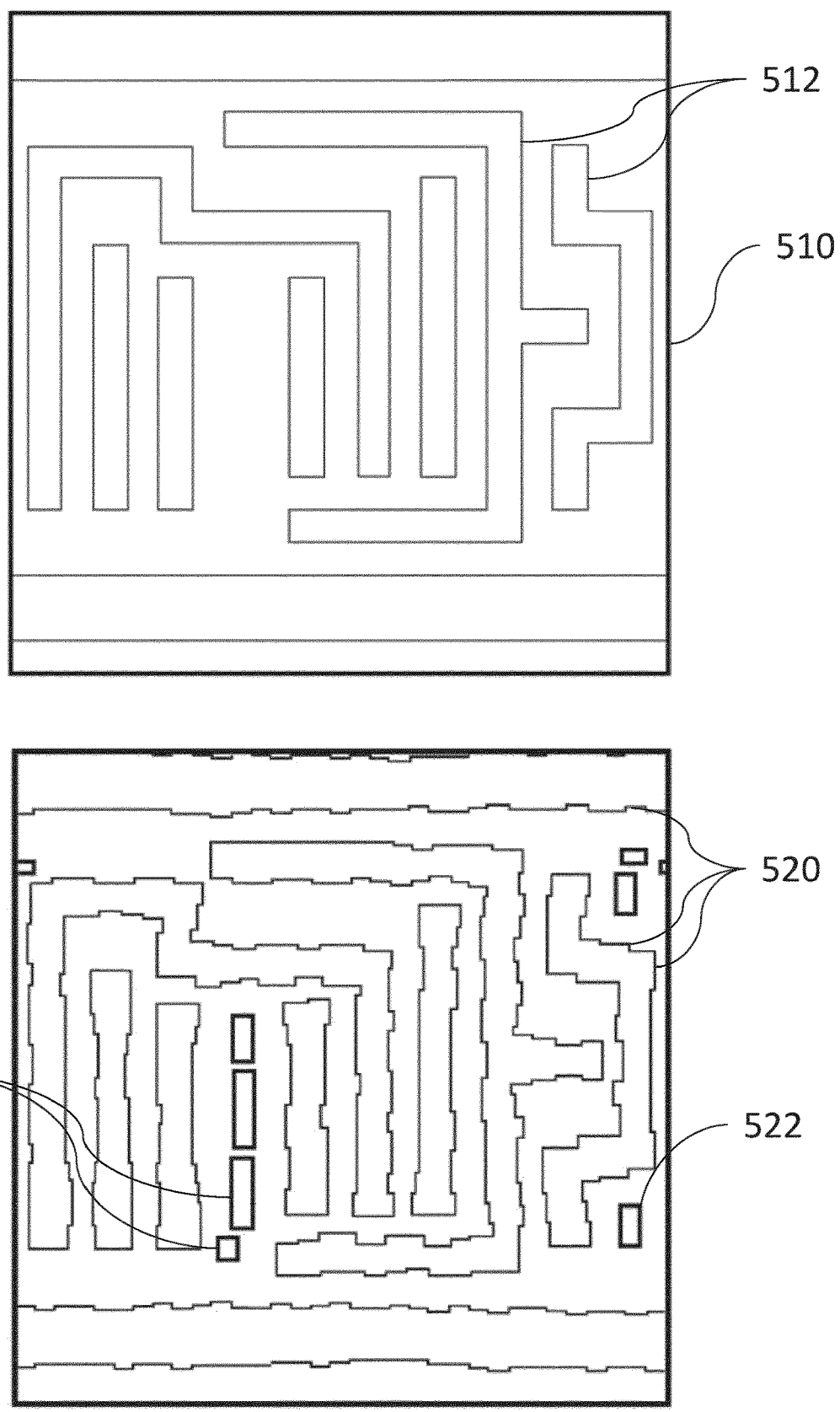
FIG. 5 is a diagram illustrating exemplary mask patterns, according to an embodiment.

FIG. 5 is a diagram illustrating exemplary mask patterns, according to an embodiment.

In many lithographic processes, is desired to use a mask to perform selective blocking of light to effect a particular pattern on a photoresist or a substrate. As used herein, a "mask" refers to an actual physical mask itself. In contrast, as used herein, a "mask pattern" refers to the shape of the features of the mask. Such features can include, for example, channels, slots, holes, ridges, varying areas of different optical transmission (e.g. in a continuous transmission mask), or the like. An ideal mask pattern 510 is illustrated in the top portion of FIG. 5. Here, the ideal mask pattern 510 is made up of perfect horizontal and vertical lines, and such are referred to herein as main features 512. However, in an actual lithographic process, diffractive effects and limitations of the resolution of light delivered do not permit such an ideal mask pattern 510 to be reproduced at the substrate. To compensate for these limitations, a process known as optical proximity correction (OPC) can be implemented. OPC adds small features (referred to as assist features 520) to the mask which, when combined with the pattern of light incident on the mask, create an improved pattern (also known as the aerial image) at the substrate. In the illustration of FIG. 5, these assist features 520 are added to main features 512 and can be seen as slight deviations from the ideal mask pattern 510. Also, in some cases, entirely new features can be added to further compensate (or take advantage of) diffractive effects. These are referred to herein as sub-resolution assist features (SRAF) 522 are also illustrated in the bottom portion of FIG. 5 by the heavier weight lines that are not present in the ideal mask pattern 510. As used herein, the general term "assist feature" can refer to either the assist features 520, which are shown as modifications to main features 512, or can refer to SRAFs 522.

Figure 6:
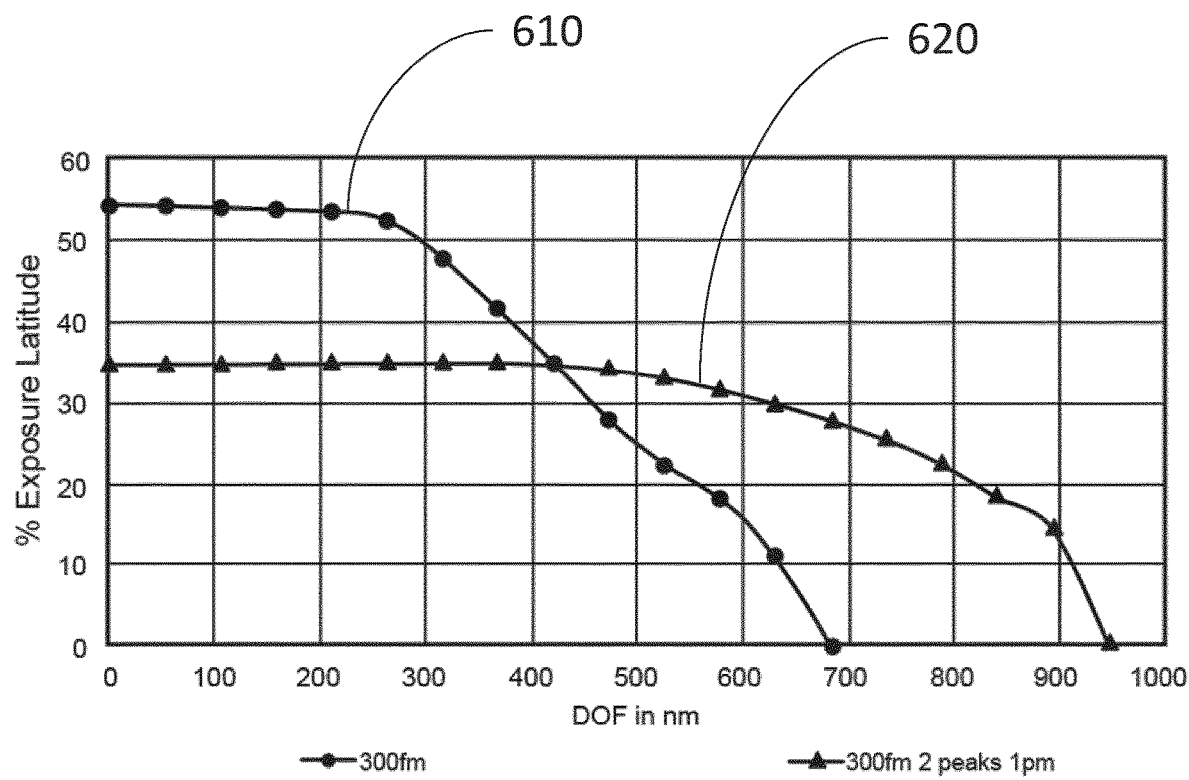
FIG. 6 is a diagram illustrating an exemplary effect of using two-color light, according to an embodiment.

FIG. 6 is a diagram illustrating an exemplary effect of using two-color light, according to an embodiment.

The present disclosure provides, among other things, a method for increasing a depth of focus for a lithography system. The method can include providing an optical spectrum, a mask pattern, and a pupil design, that together are configured to provide the lithography system with a depth of focus. The method can also include iteratively varying the optical spectrum and a configuration of one or more mirrors in a mirror array to provide a modified optical spectrum and a modified pupil design that increases the depth of focus. One or more of the mirrors of the mirror array can then be configured based on the modified pupil design and the modified mask pattern that increases the depth of focus. As used herein, "depth of focus" means a distance over which light at a desired location (e.g., at the substrate, at a photoresist, etc.) is considered to be "in focus." The particular numbers corresponding to whether light is in focus can be defined automatically, by a user, and can vary as requested for a given application, and such can be referred to as a "specification."

In FIG. 6, a plot of exposure latitude versus depth of focus is shown for a one color optical spectrum 610 (circle symbols) and a two-color optical spectrum 620 (triangle symbols). Here, by changing the optical spectrum from one color to two color (e.g., in simulations that are performed according to one or more of the models as described herein, such as an OPC, resist, source, etc.), an increased depth of focus results, along with a change in the exposure latitude.

The modified optical spectrum (or any "modified" feature) need not be a final or optimized feature, although it may be. For example, the modified optical spectrum can be an intermediate step where an initial optical spectrum has been modified but may not be at a final solution. However, the modified features, as described herein, can be an optimized or best solution of the particular aspect involved (e.g., the modified optical spectrum, modified mask pattern, or modified pupil design). This is further discussed with reference to FIG. 13.

In some embodiments of the present disclosure, the concurrent variations can be implemented by computer-implemented process collectively referred to herein as an optimization module. An optimization module can co-optimize and analyze any number of aspects of the lithography system, for example, the optical spectra, mask pattern, pupil design, main features, SRAFs, etc. The optimization module can include any number of computer programs distributed across any number of computing systems. Predictive modeling and machine learning techniques (e.g. trained models that are part of optimization module) can also be included. Optimization module can provide improved solutions in the form of graphical displays, data files, and the like. These solutions can include, for example, mask patterns, photoresist parameters, light source settings, pupil configurations, etc.

In some embodiments, the optimization module can modify and/or optimize the optical spectrum, for example to increase or maximize a depth-of-focus. Accordingly, in an embodiment, the iterative variation can include varying a bandwidth of a peak in the optical spectrum 340. Similarly, in another embodiment, the iterative variation further can include varying a peak separation 346 between two (or more) peaks in optical spectrum 340.

Due to the interdependence between some components of the lithography system, and as accounted for with the co-optimization by optimization module, changing one aspect of the lithography system may affect another aspect. For example, when increasing a depth of focus, changing optical spectrum 340 can result in a change in pupil design 410 so that, for example, contrast loss can be reduced. As used herein, the illustrations shown of optical spectra, pupil designs, and mask patterns can refer equally initial or modified versions, and for simplicity are both referred to herein by similar reference numbers. Modified pupil design 410 can be realized as a data file containing programming instructions or operation sequences of the mirror array. For example, the modified pupil design can specify the angles or orientations of the mirrors in mirror array 430 such that the desired modified pupil design 410 is created.

Figure 7:
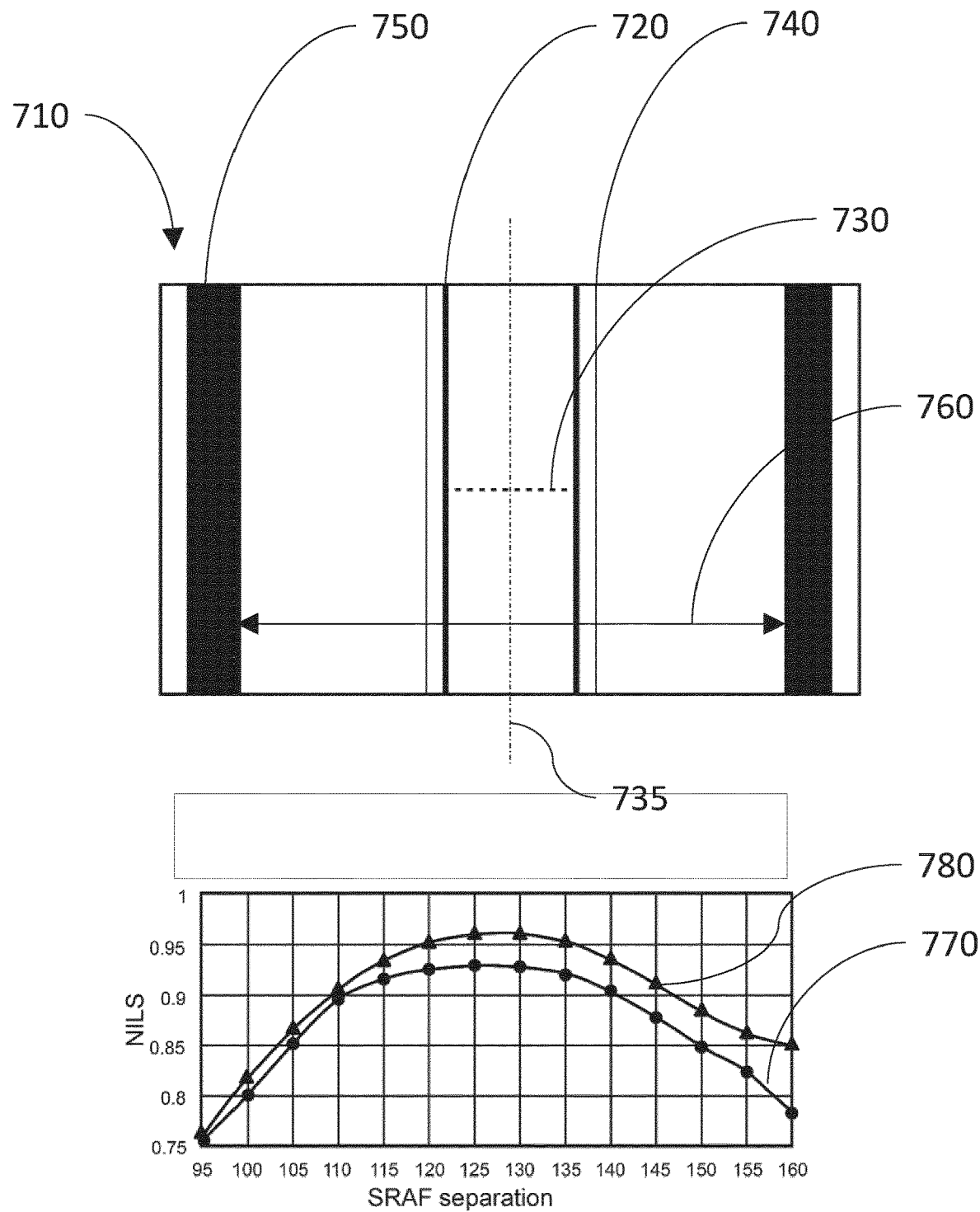
FIG. 7 is a diagram illustrating an exemplary separation of sub-resolution assist features based on the optical spectrum, according to an embodiment.

FIG. 7 is a diagram illustrating an exemplary separation of sub-resolution assist features based on the optical spectrum, according to an embodiment.

A simplified example of a portion of mask pattern 710 is shown in the top panel of FIG. 7. Here, the mask pattern 710 shows main feature 720, critical dimension 730, mask bias 740, and two SRAFs 750 separated from the center of the main feature by an SRAF separation 760.

Similar to the embodiments described above where changes in the optical spectrum can result in changes to the pupil design, the method can include providing an optical spectrum, a mask pattern 710, and a pupil design, that together are configured to provide the lithography system with a depth of focus. The method can also include iteratively varying the optical spectrum and an assist feature in the mask pattern to provide a modified optical spectrum and a modified mask pattern that increases the depth of focus. A component of the lithography system can then be configured based on the modified optical spectrum and the modified mask pattern 710 that increases the depth of focus. The component can include, for example, any combination of the mask, the light source, the pupil, or other components of the lithography system. Broadly, the process of optimizing the illumination light spectrum, the pupil, and the mask is called source-mask optimization (SMO).

Mask pattern 710 can be iteratively varied concurrently with the optical spectrum to provide the modified optical spectrum and a modified mask pattern 710. The iterative variation can also include varying a main feature 720 in the mask pattern 710 to increase the depth of focus. A main feature 720 can include an edge location and/or a mask bias 740, and the iterative variation can also vary at least one of the edge location or the mask bias location. In some embodiments, two mask bias locations can be symmetrically varied about center 735 of main feature 720. As used in such embodiments, symmetrically varied means making the corresponding variation in mask bias location on either side of center 735 of main feature 720 such that the mask bias locations have the same distance from the center 735 of main feature 720.

The modified mask pattern 710 can include changes to features added by performing OPC on the mask (similar to what is illustrated in FIG. 5) or to SRAFs. Also, as illustrated in FIG. 7, the iterative variation can include varying a sub-resolution assist feature in the mask pattern 710 to increase the depth of focus. In some embodiments, the iterative variation can include varying of the sub-resolution assist feature 750 by changing at least one of a position or width of the sub-resolution assist feature 750. As shown in the bottom panel of FIG. 7, when comparing a one-color optical spectrum (circles) 770 to a two-color optical spectrum (triangles) 780, the normalized image log-slope (NILS), which is a measure of aerial image quality, is maximized by a different SRAF separation 760. In the example given, for a peak NILS, the separation 760 changes from 125 nm (with a one-color optical spectrum) to 130 nm (with a two-color optical spectrum). In this way, optimization module can determine a separation 760, location, etc. of SRAFs 750 that increases the quality of the aerial image.

Figure 8:
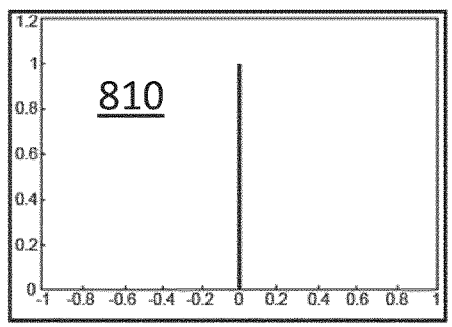
FIG. 8 is a diagram illustrating a first example of concurrently optimizing the optical spectrum, mask pattern, and pupil design, according to an embodiment.
Figure 8:
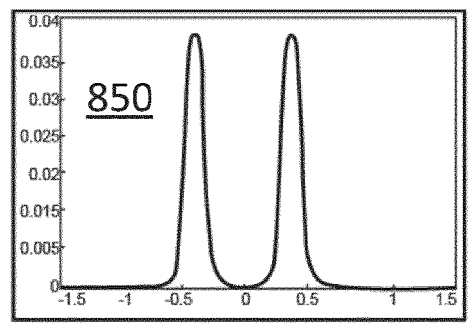
Figure 8:
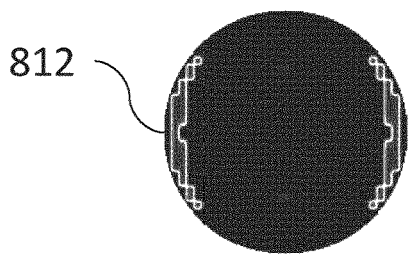
Figure 8:
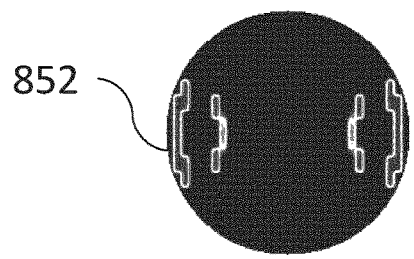
Figure 8:
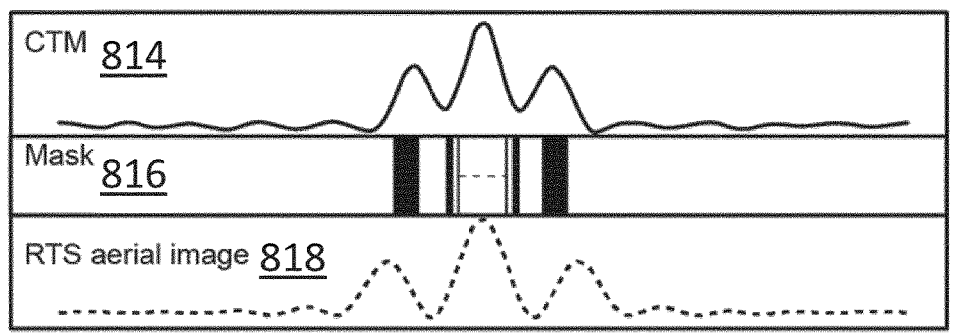
Figure 8:
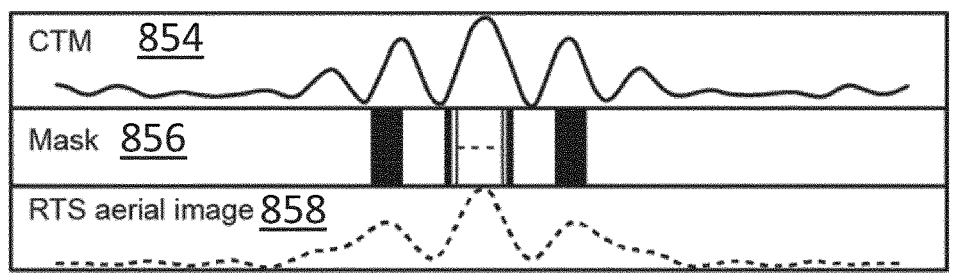
Figure 8:
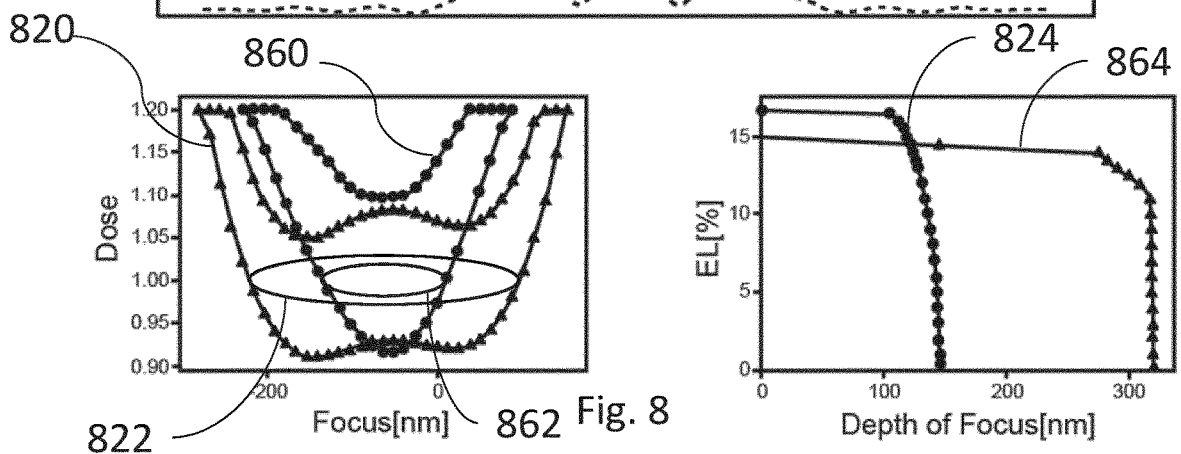

FIG. 8 is a diagram illustrating a first example of concurrently optimizing the optical spectrum, mask pattern, and pupil design, according to an embodiment.

Optimization of a combination of the aspects of the lithography system as described herein can result in the benefits to the performance of lithography system as illustrated in FIG. 8. Shown is a simulated single-color optical spectrum 810 (with an arbitrarily small bandwidth) and also a simulated two-color optical spectrum 850. Examples of modified pupil designs 812 and 852 are shown for single-color optical spectrum 810 and two-color optical spectrum 850, respectively. For single-color optical spectrum 810, FIG. 8 illustrates simulated continuous transmission mask (CTM) 814, mask 816 (e.g. a representation of a mask where there are slots that correspond to the main features and assist features) and the resulting aerial image 818. Similarly, for two-color optical spectrum 852, a CTM 854, mask 856, and aerial image 858 are also shown. While generally similar in appearance, there are differences between the two solutions (most easily seen by the change in separation of the SRAFs in the masks 816 and 856). The result of the solutions are shown in the bottom two panels of FIG. 8, where the optimization increases the process window (PW). Process window is illustrated by the area between the curves and is a function of the provided dose at a given focus. The dose-focus curve corresponding to the two-color optical spectrum is shown by the triangle points 820 and the one-color optical spectrum by the circle points 860. The two ovals 822 and 862 that touch their respective curves correspond to an ideal PW. It can be seen, in the lower right panel, that the process window is increased when two color optical spectrum is implemented along with optimization of the mask pattern and the pupil design. Similarly, in this example, the two-color depth of focus 864 (shown by the triangles on the lower right panel) is increased over the one-color depth of focus 824 from about 144 nm to 320 nm, with only a slight decrease in exposure latitude.

Any sort or number of metrics can be increased or optimized by the methods disclosed herein. While there can be a trade-offs between some parameters increasing and other parameters decreasing (e.g., DOF vs. EF) as a result of the variations, in some embodiments, the iterative variation can include performing the variation at least until a product of the depth of focus and an exposure latitude is increased. Similarly, the iterative variation can include performing the iterative variation at least until a process window, based on an area defined at least partly by a dose and an exposure latitude, is increased.

Figure 9:
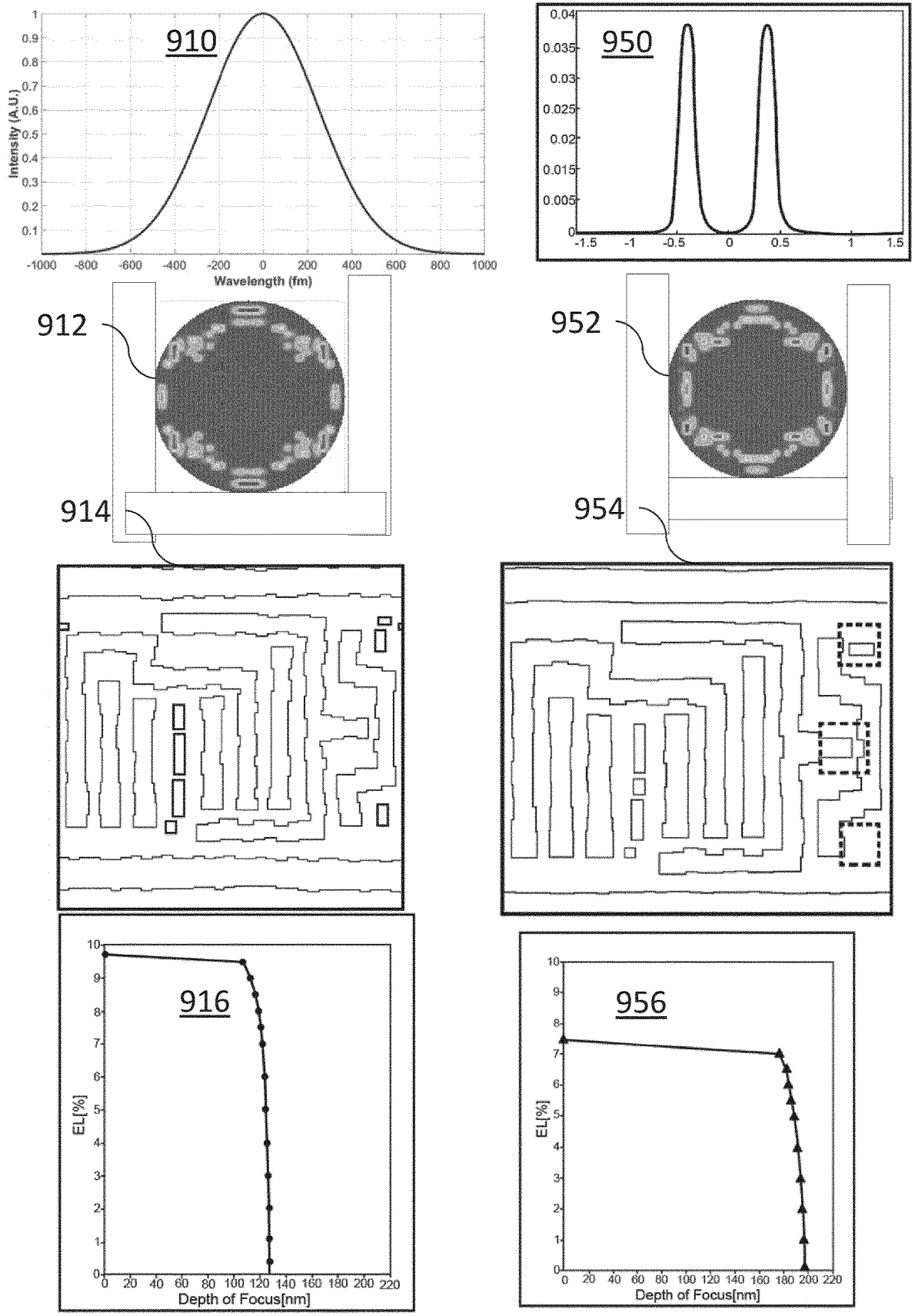
FIG. 9 is a diagram illustrating a second example of concurrently optimizing the optical spectrum, mask pattern, and pupil design, according to an embodiment.

FIG. 9 is a diagram illustrating a third example of concurrently optimizing the optical spectrum, mask pattern, and pupil design, according to an embodiment.

The embodiment illustrated in FIG. 9 can include iteratively varying, concurrently, optical spectrum 910, mask pattern 914, and pupil design 912 to provide modified optical spectrum 950, modified mask pattern 954, and modified pupil design 952. While similar to FIG. 8, FIG. 9 shows the mask pattern 914 and the modified mask pattern 954 where not only have the small features along the main feature changed, but entirely new SRAFs have appeared (or disappeared) as part of the improved solution. These regions of notable change are indicated by the dashed lines. Similar to the example of FIG. 8, the depth of focus for a two-color optical spectrum significantly increases with only a modest decrease in exposure latitude when using one color optical spectrum.

Figure 10:
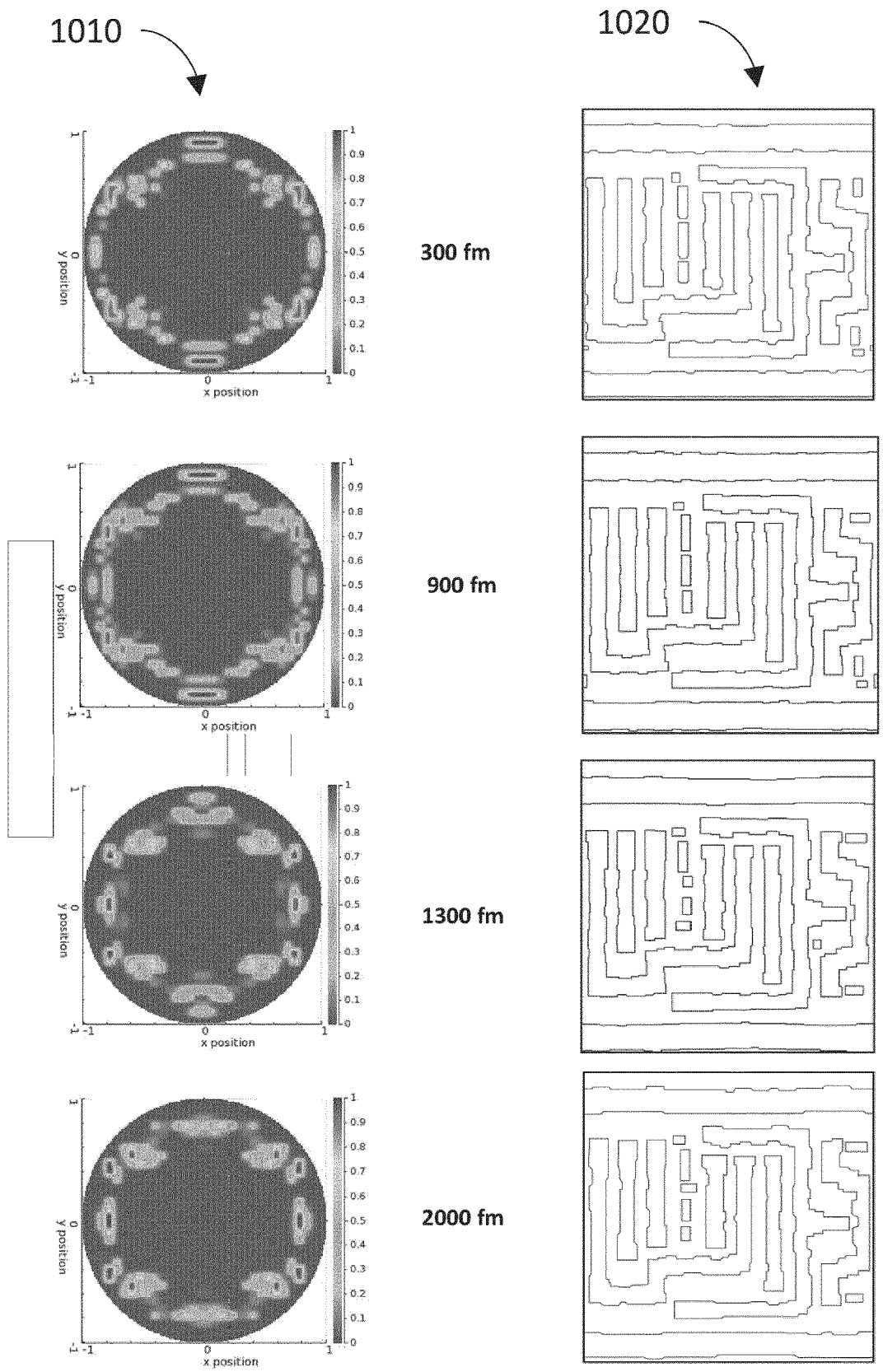
FIG. 10 is a diagram illustrating changes to a mask pattern and pupil design based on changes to bandwidth in an optical spectrum, according to an embodiment.

FIG. 10 is a diagram illustrating changes to a mask pattern and pupil design based on changes to bandwidth in an optical spectrum, according to an embodiment.

In addition to the varying the center wavelengths of a two-color optical spectrum, a bandwidth of one or more peaks of an optical spectrum can also be varied as part of the optimization process. As a simplified example, FIG. 10 shows four pupil designs 1010 where the bandwidth (e.g., 300 fm, 900 fm, 1300 fm, 2000 fm) of a one-color optical spectrum was varied. It can be seen that optimization module can generate a modified mask pattern 1010 and modified pupil design 1020 in order to attempt to maintain or increase the contrast at the aerial image. Accordingly, in some embodiments, the iterative variation can include constraining the variation to increase a contrast at the aerial image when the variation of the optical spectrum results in an increase in bandwidth of a peak in the optical spectrum. While shown for a one-color optical spectrum, a similar process can be applied using a two-color optical spectrum.

As apparent from the present disclosure, there are many possible optimizations that can result from varying aspects of the lithography system concurrently. While not every permutation has been described in detail, all such permutations are considered within the scope of the present disclosure. For example, optical spectrum, bandwidth, peak separation, mask pattern, main features, assist features, pupil design, process models (OPC, resist, etc.), can be varied in any combination to improve the lithography system. Similarly, the variations can be performed to improve any combination of depth of focus, exposure latitude, dose, focus, contrast, NILS, process window, etc. Additionally, the variations can be performed to reduce any combination of edge placement error, mask error enhancement factor (MEEF), etc.

As described herein, embodiments of the present disclosure can be used to provide prescriptions for configuration of a lithography system. As such, based on solutions provided by the optimization process, components of the optical system can be constructed and/or configured to realize the determined benefits. For example, in an embodiment, the component can be a laser configured to provide light based on the modified optical spectrum. In an embodiment, the component can be a mask manufactured based on the modified mask pattern. In an embodiment, the component can be a pupil in the form of a diffracted optical element manufactured based on the modified pupil design. In another embodiment, the pupil can be a mirror array configured based on the modified pupil design. Another embodiment can include both configuring a mirror array based on the modified pupil design, and also manufacturing a mask based on the modified mask pattern.

Figure 11:
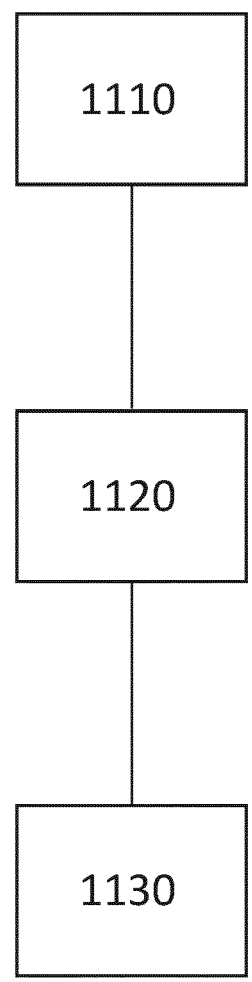
FIG. 11 is a process flow diagram illustrating an exemplary method for increasing a depth of focus, according to an embodiment.

FIG. 11 is a process flow diagram illustrating an exemplary method for increasing a depth of focus, according to an embodiment.

In an embodiment, a method for increasing a depth of focus for a lithography system can include, at 1110, providing an optical spectrum, a mask pattern, and a pupil design, that together are configured to provide the lithography system with a depth of focus. The method can, at 1120, iteratively varying the optical spectrum and an assist feature in the mask pattern to provide a modified optical spectrum and a modified mask pattern that increases the depth of focus. At 1120, a component of the lithography system can based on the modified optical spectrum and the modified mask pattern that increases the depth of focus.

Figure 12:
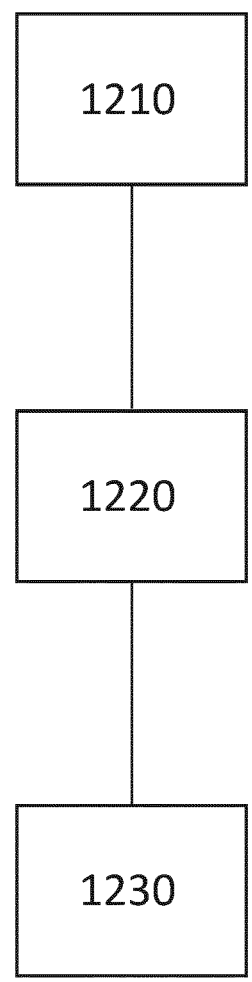
FIG. 12 is a process flow diagram illustrating an exemplary method for increasing a depth of focus based on a modified optical spectrum and a modified mask pattern, according to an embodiment.

FIG. 12 is a process flow diagram illustrating an exemplary method for increasing a depth of focus based on a modified optical spectrum and a modified mask pattern, according to an embodiment.

In an embodiment, a method for increasing a depth of focus for a lithography system can include, at 1210, providing an optical spectrum, a mask pattern, and a pupil design, that together are configured to provide the lithography system with a depth of focus. The method can, at 1220, iteratively varying the optical spectrum and a configuration of one or more mirrors in a mirror array to provide a modified optical spectrum and a modified pupil design that increases the depth of focus. At 1220, one or more mirrors of the mirror array can be configured based on the modified optical spectrum and the modified pupil design that increases the depth of focus.

Figure 13:
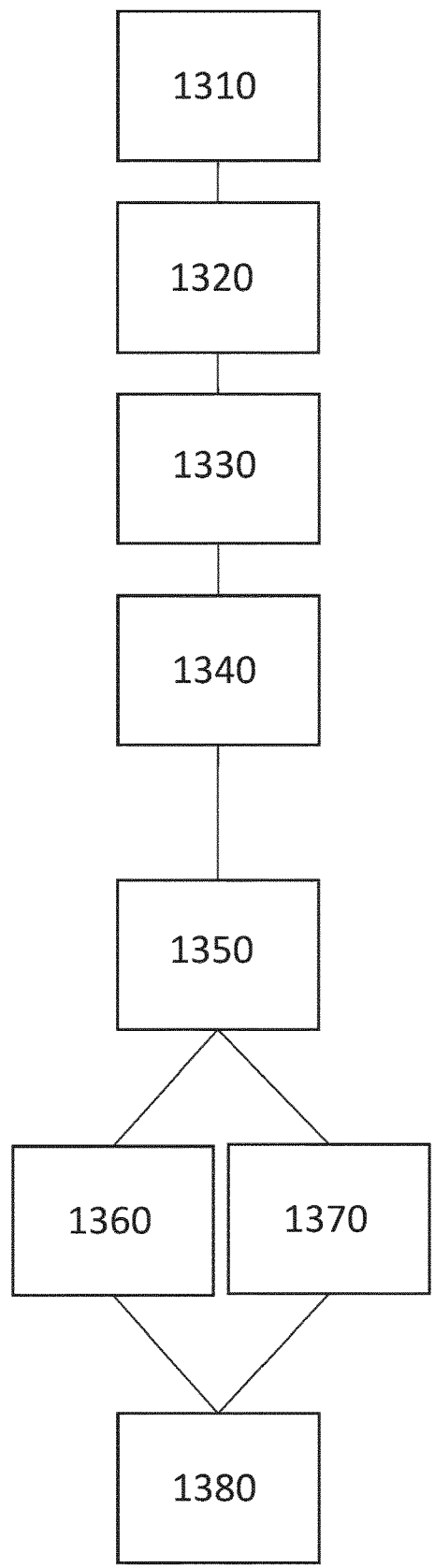
FIG. 13 is a process flow diagram illustrating an exemplary iterative method for increasing a depth of focus, according to an embodiment.
Figure 14:
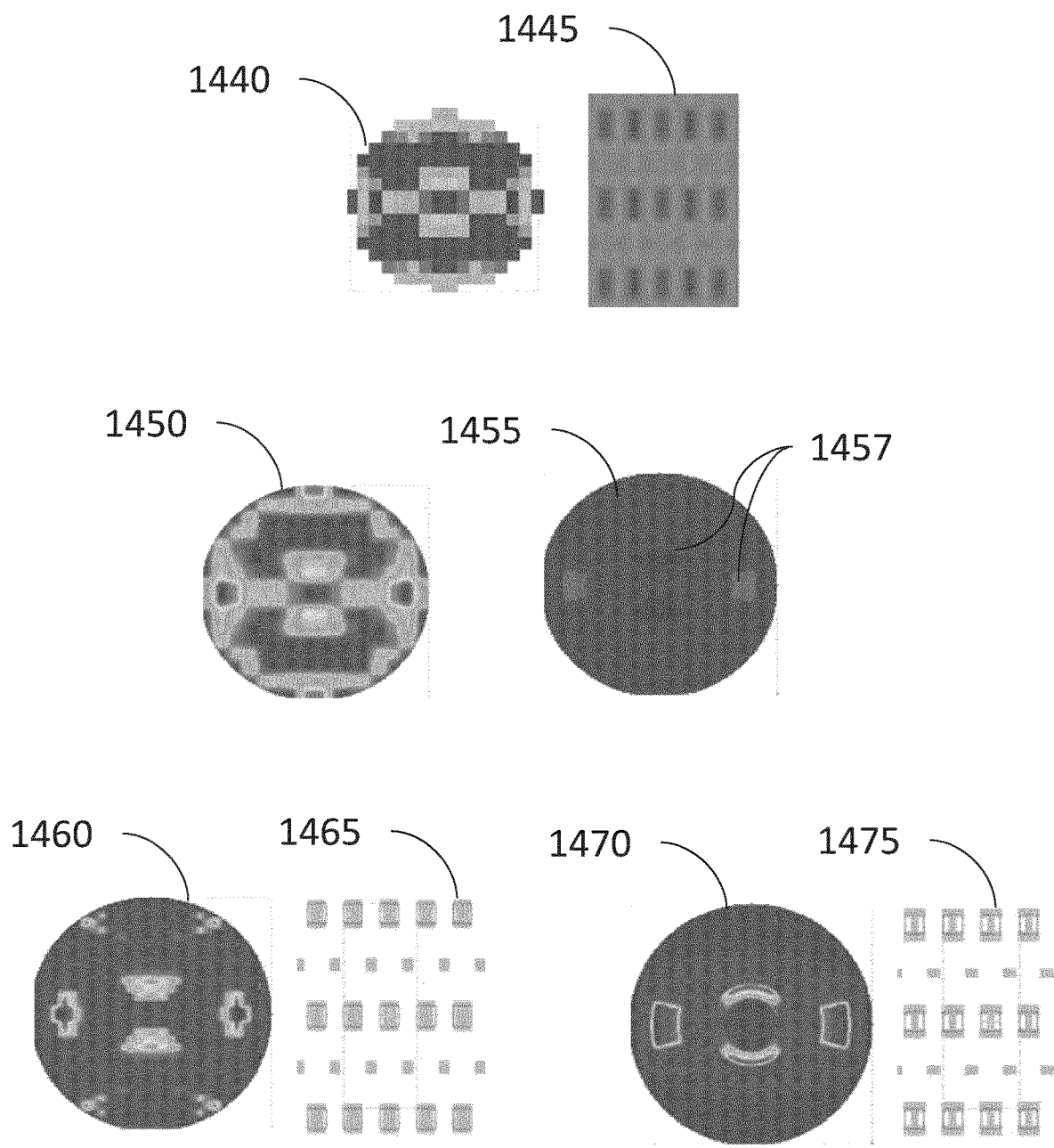
FIG. 14 is a diagram illustrating examples of pupil designs and mask patterns corresponding to the process shown in FIG. 13, according to an embodiment.

FIG. 13 is a process flow diagram illustrating an exemplary iterative method for increasing a depth of focus, according to an embodiment. FIG. 14 is a diagram illustrating examples of pupil designs and mask patterns corresponding to the process shown in FIG. 13, according to an embodiment.

Performing a co-optimization (or concurrent optimization process) involving varying features of two or more of an optical spectrum, a pupil design, or a mask pattern, can be iteratively performed to generate, for example, a modified optical spectrum, modified pupil design, or modified mask pattern that will result in an increased depth of focus. For example, when a desired metric is not met (e.g., 150 nm DOF at 5% EL), a spacing between two or more of the peaks in the optical spectrum can be varied to determine a spacing that achieves the desired metric. Additionally, constraints can be applied such that the optical spectrum, pupil design, and mask pattern meet certain process requirements, such as a mask having a particular transmission or a pupil having particular physical properties. One example implementation of a co-optimization of the spectrum, pupil design, and mask pattern, including examples of such constraints, is described below.

At 1310, setup parameters that specify aspects of the lithography system can be obtained/set for computational simulations (e.g., to perform the co-optimization processes) as described herein. The setup parameters can include any combination of imaging conditions, including polarizations of light from the light source, the configuration of film stacks that the photoresist is coated over, mask rule check (MRC) parameters, the photoresist, the photoresist thickness, the film stack that the photoresist is coated over, the capability of the scanner (e.g., numerical aperture, polarization, Zernike coefficients), etc. These parameters can be received from another computer and be in the form of data files, and can also include default setup parameters containing default values of any of the above. Optionally, the setup parameters can be defined by a user and stored as a data file or in temporary computer memory.

At 1320, an optical spectrum (e.g., as shown by elements 310 or 340 in FIG. 3) can be generated. Initially, an optical spectrum can include a single-wavelength (meaning having a single center-wavelength/peak). In other implementations, as described herein, a multiple wavelength optical spectrum (e.g., two, three, or more center wavelengths/peaks) can be generated. In some embodiments, the bandwidth of any of the optical spectra (single or multiple) can initially be set at, for example, 200 fm, 300 fm, 400 fm, etc., and then varied throughout the iterative process.

At 1330, a process window based point-source model can be generated. This can model the light source as a point source, but in some implementations can include more complicated source models such as finite-sized source approximations. The process window conditions can be defined, for example, optimizing to achieve a process window having 150 nm depth of focus at 5% exposure latitude, or approaching such a target process window until a best convergence is reached based on the other constraints of the simulation. Such numbers are intended as examples only, for example the process window can be based on any combination of process windows having depths of focus of more than 1, 5, 10, 20, 50, 75, 150, 200, 300, 500, or 1000 nm. Similarly, the exposure latitude can be defined to be less than 1%, 3%, 8%, 10%, 15%, 20%, 30%, or 50%.

At 1340, an unconstrained pupil design 1440 (a graphical example of such as shown in FIG. 14) can be generated for incorporation into the iterative process. Unconstrained pupil design 1440 allows for any intensity of light at any pixel of the pupil. Because the unconstrained pupil can have any values and (at this stage in the iteration) mask constraints have not yet been applied, a mask pattern can be generated that has continuous (or smoothly varying) transmission properties (similar to that found in a continuous transmission mask (CTM)). An example is shown by the greyscale CTM pattern 1445.

At 1350, a pupil map can be applied to unconstrained pupil design 1440. The pupil map can define features (see the examples below) of the pupil that are currently unconstrained. Two examples of pupil maps are a freeform pupil map 1450 or parametric pupil map 1455, the applying of which can result in a constrained pupil design.

A freeform optimization can include applying freeform pupil map 1450 to, for example, specify a pupil resolution (e.g., as set by the resolution of a diffractive optical element, which can be made up of hundreds or thousands of mirror, each conforming to a pixel in a pupil map). This is illustrated by comparing the example of the coarse unconstrained pupil design 1440 to freeform pupil map 1450. Here, we see that the freeform optimization does not change the general light pattern at the pupil, but increases the resolution.

A parametric optimization can include constraining features of the pupil as illustrated by parametric pupil map 1455. One example of a feature that can be specified as a constraint is the value of sigma, or pupil fill factor. Various regions (also referred to as poles 1457) of the parametric pupil map 1455 are shown that have sigma expressed in terms of, for example, the pole intensity (i.e., the value of sigma in the region), a pole angle (i.e., angle at the center of the region), "pole width (i.e., angular extent of the region), sigma_in (i.e., the inner radius), and sigma_out (i.e., the outer radius). It should be understood that the examples shown in FIG. 14 are examples only, and that any pupil patterns (whether freeform or parametric) can be used. In other embodiments, constraints on the pupil can also be based on the physical features of the diffractive optical element and can include, for example, mirror reflectance, resolution, mirror location, etc.

Mask and/or physical pupil constraints can also be generated and applied in conjunction with the freeform or parametric optimization. The mask constraints can be used to generate a modified mask pattern, as described herein. Mask constraints can include, for example, mask transmission, phase effects on the mask, locations for SRAF seeding, OPC features, etc.

At 1360 (when a freeform source was defined at 1350) concurrent modification (or optimization) of the constrained pupil design with the applied mask constraints can generate the modified pupil design and the modified mask pattern. FIG. 14 also shows one example of the resulting co-optimized pupil 1460 and mask pattern 1465. At this stage, the mask pattern can optionally be binarized (having a discrete transmission values on the mask pattern instead of the initial CTM pattern prior to co-optimization).

Similarly, at 1370 (when a parametric source map was defined at 1350), concurrent modification (or optimization) of the constrained pupil design with the applied mask constraints can occur to generate the modified pupil design and the modified mask pattern. One example of the resulting modified pupil and modified mask pattern is shown. It can be seen that the resulting pupils (1460 and 1470) and mask patterns (1465 and 1475) are different due to the differences in the co-optimization mode selected.

At 1380, a process window and/or optionally MEEF can be calculated based on the modified mask pattern and pupil design. As mentioned above with regard to an example desired metric (e.g., a process window), if the process window does not meet the process window conditions defined initially at 1320, the optical spectrum can be modified, for example by changing a bandwidth, peak separation, number of peaks, or the like. The modified optical spectrum can be input as a setup parameter for the process to repeat such that closer agreement to the desired process window is achieved. Any of the other setup parameters can optionally be changed as well. In this way, after 1380, the iterative process can return to any prior step described above, for example, 1310 or 1320.

When the process window is met, the results of the modified optical spectrum, mask pattern, and/or pupil design can be provided as data output to one or more computing systems. In some implementations, the process can stop at a best convergence toward a specified process window after a predefined number of iterations.

When the above described multi-color or two-color imaging process is used, there may be a degree of image blurring as a result of the difference in focal planes between the two different wavelengths of light. Moreover, because the projection optical system is optimized for a particular wavelength, deviation from the optimum wavelength may introduce lens errors that further contribute to blurring. This can lead to a loss of contrast in the resulting imaged features.

To some degree, the above described methods relating to source-mask optimization can be used to offset this loss of image quality. Likewise, optical proximity correction techniques can be used to assist in imaging the features as designed. FIG. 8, above, shows the large improvement in depth of focus produced by use of the two-color imaging, but also shows a loss of contrast that accompanies it.

Two image quality metrics that are related to contrast are the image log slope (ILS) or the normalized image log slope (NILS). The higher the NILS, the better the image contrast, which directly translates into improved exposure latitude.

Contrast can be thought of as a ratio between dark and light portions of the image. Image log slope, on the other hand can be thought of relating to a rate of change of brightness at an edge between a dark and a light area of the image. Thus, both are concerned with a comparison between light and dark, but ILS relates more particularly to transition areas, and thus is more specifically related to line edge position and therefore linewidth and other image quality metrics than is contrast. Defocus and blur (such as may be caused by use of two-color imaging) can have detrimental effects on ILS.

Because ILS is proportional to the inverse of a critical dimension (such as linewidth) a normalization of ILS can be calculated by multiplying by that critical dimension so that $NILS=ILS*x=dI/dx*1/x*x=dI/dx$. ILS and NILS can then be related to exposure latitude by simulation and/or empirical methods in a manner understood by the skilled artisan.

Figure 15:
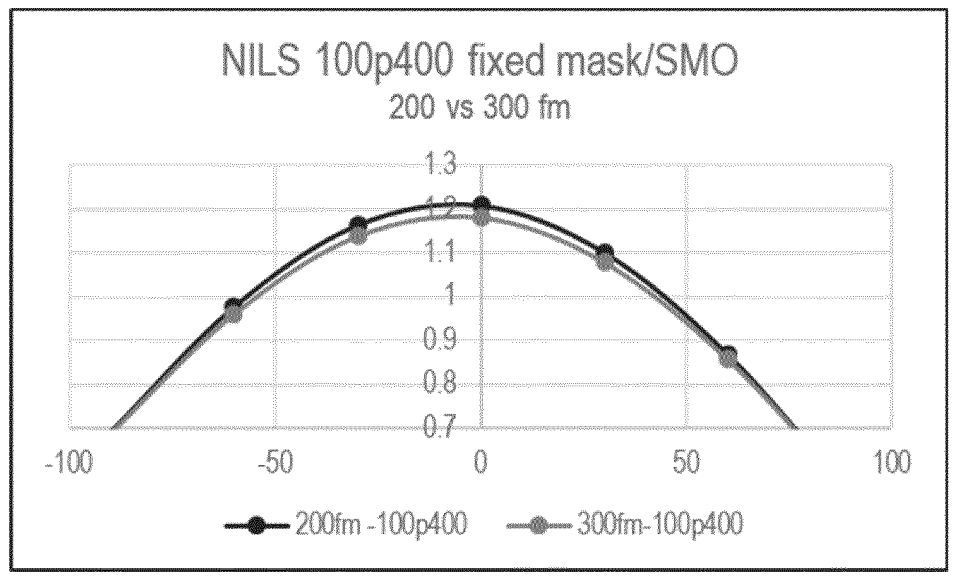
FIG. 15 is a diagram illustrating a simulated improvement in normalized image log slope (NILS) produced by use of a narrow bandwidth light source in accordance with an embodiment.

FIG. 15 illustrates a simulated effect of application of bandwidth narrowing in accordance with an embodiment. In particular, the graph shows NILS for 100 nm lines at a 400 nm pitch, plotted against a deviation from optimal focus in both positive and negative directions. The grey line represents a simulated NILS curve for a light source using a 300 fm bandwidth (E95), while the black line represents the effect of using a 200 fm bandwidth. As can be seen from the figure, the NILS is somewhat higher across the range of defocus.

Figure 16:
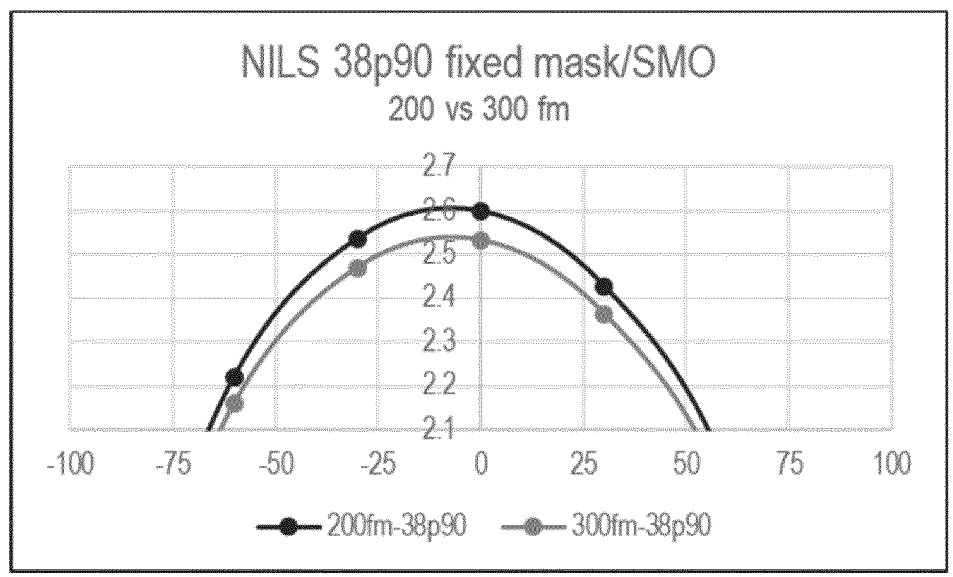
FIG. 16 is a diagram illustrating a simulated improvement in NILS produced by use of a narrow bandwidth light source in accordance with an embodiment.

Similarly, FIG. 16 illustrates a simulated effect of application of bandwidth narrowing in accordance win an embodiment. This graph shows NILS for 38 nm lines at a pitch of 90 nm. That is, the second graph relates to finer features at a finer pitch than does that of FIG. 15. Again, across the range of defocus as illustrated, the bandwidth narrowing produces improved values of NILS.

Figure 17:
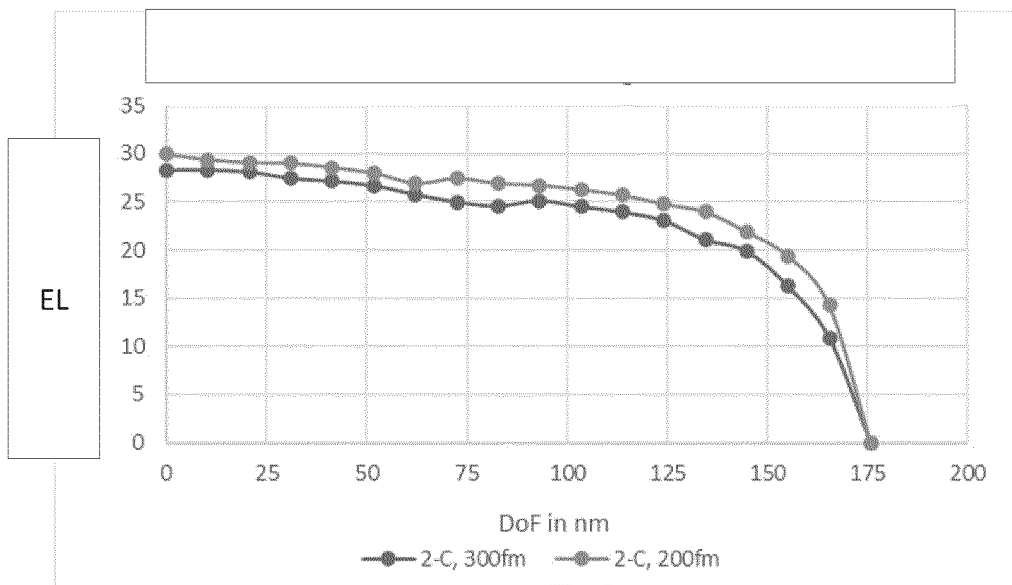
FIG. 17 is a diagram illustrating a simulated improvement in exposure latitude (EL) produced by use of a narrow bandwidth light source in accordance with an embodiment.
Figure 18:
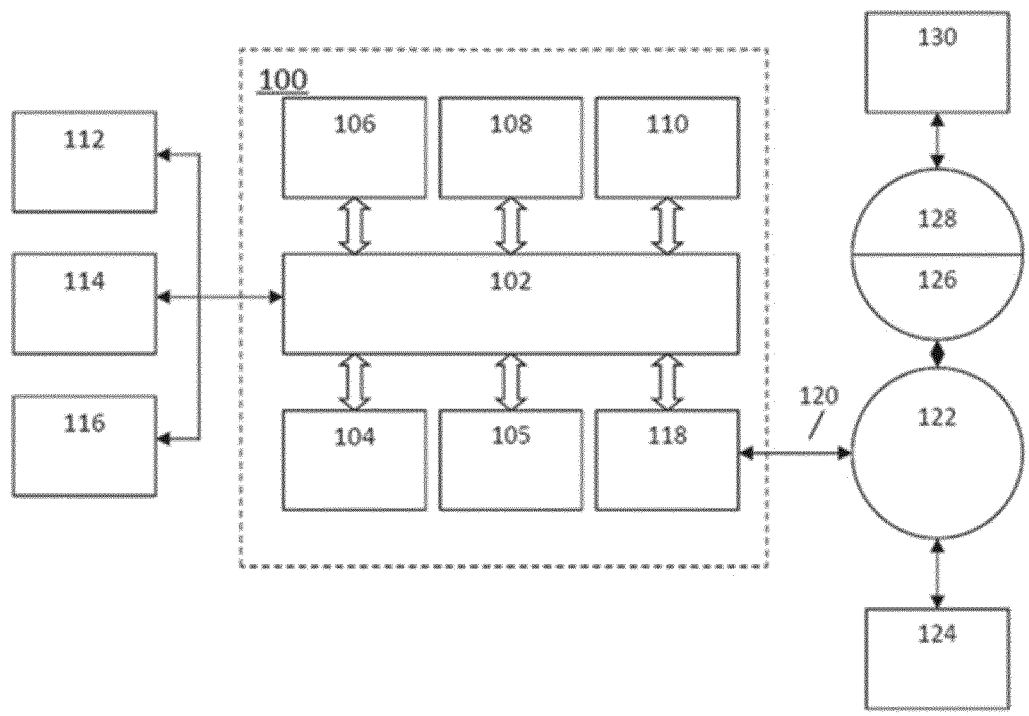
FIG. 18 is a block diagram of an example computer system, according to an embodiment.
Figure 19:
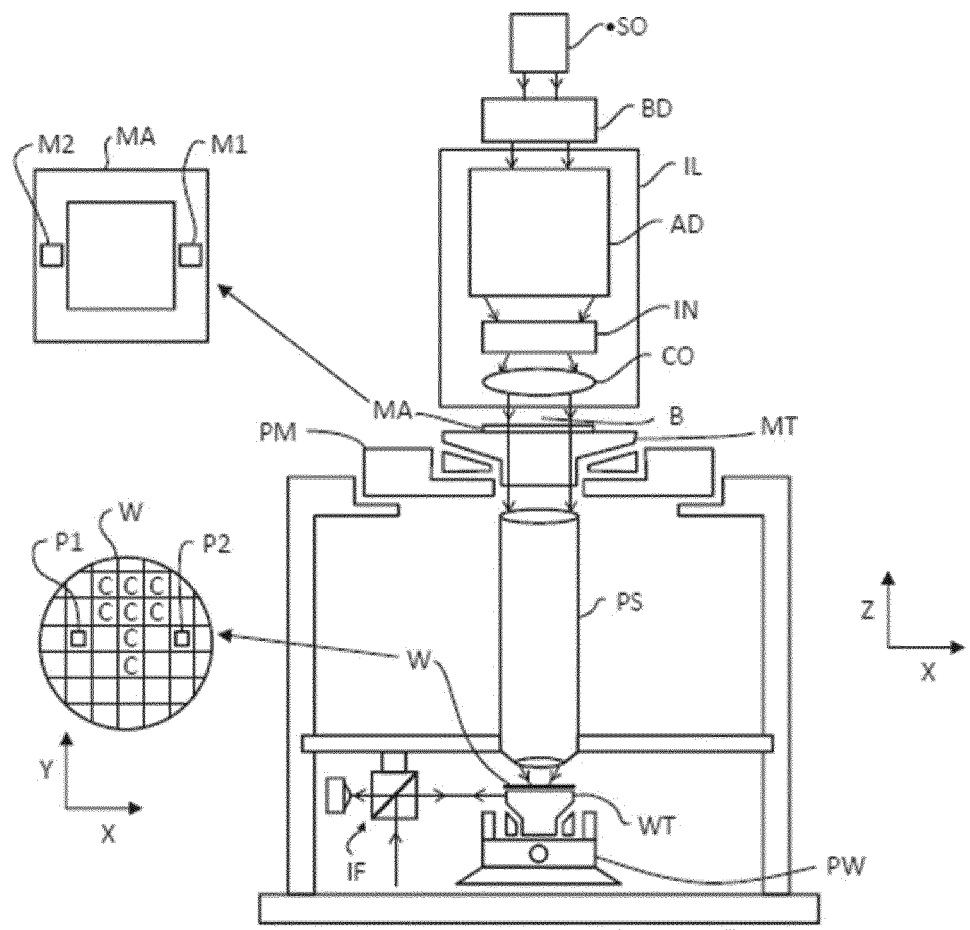
FIG. 19 is a schematic diagram of a lithographic projection apparatus, according to an embodiment.

FIG. 17 illustrates a simulated graph of exposure latitude (EL) vs depth of focus in a two-color image using ordinary (300 fm bandwidth—shown in black) and narrowed (200 fm bandwidth—shown in grey) illumination light. As can be seen, EL is improved across the range of depth of focus as a result of the bandwidth narrowing.

In a typical laser light source for a DUV photolithography system, the laser includes a line-narrowing module that is operable to effect a narrowing of the laser light bandwidth. In an embodiment, the bandwidth can be reduced from the typical 300 fm to a range of 50 fm to 275 fm, more particularly to a range of 100 fm to 250 fm, and more particularly to a range of 150 fm to 225 fm. In an embodiment, the bandwidth is selected to be 200 fm.

In an embodiment, in accordance with known principles, the laser may include actuatable prism or prisms and a grating. The actuator, which may be, for example, a stepper motor and/or PZT is configured to rotate at least one of the prisms so as to adjust the beam width and thereby alter bandwidth of the laser source. Likewise, one or the other prisms may also be mounted for rotational movement with an actuator to allow fine adjustment of the center wavelength of each pulse, such adjustments being able to be made on the order of tenths of femtometers, for example. In an embodiment, the line narrowing module may include a bandwidth measuring module to allow feedback and/or feedforward control of the bandwidth of the source. In some instances, differential firing time may be used to effect fine control, while the actuator is used to provide gross control. Further details of such a system may be found, for example, in US Pat. Pub. 20080253413, incorporated by reference herein in its entirety.

In application, a method for imaging a feature proceeds as described below with respect to FIG. 16. The method includes directing a pulsed light beam toward a mask that is configured to impart a pattern onto the pulsed beam. As described above in greater detail, the pulses have differing wavelengths to allow for two-color printing in a single exposure pass, which generates two aerial images in the resist on the wafer. A depth of focus may be selected and the selected depth of focus may be used to select a difference between the two wavelengths. As will be appreciated, more than two colors may be used to generate more than two aerial images without deviating from the principles of the disclosed method.

The two (or more) aerial images are located in focal planes that are separated by a distance along the optical axis that is determined by a difference in wavelength among the several pulses. A bandwidth of the pulses is controlled to be between 50 fm and 275 fm. Furthermore, the bandwidth is selected to improve a quality metric of the imaging process.

In particular, the quality metric may be, for example, contrast, ILS, NILS, EL, and/or a metric describing the process window.

In an embodiment, source mask optimization, as described in detail above, may be used after a narrowed bandwidth is selected. Thus, the narrowed bandwidth becomes an input variable to the SMO process and may be selected to be constant, or may be varied along with the other parameters in performing the optimization. That is, as optical spectrum 340 is narrowed, the method of iteratively simulating and adjusting the pupil design, optical spectrum, mask pattern 710 proceeds in the same manner as previously described. The method can also include iteratively varying the optical spectrum and an assist feature in the mask pattern to provide a modified optical spectrum and a modified mask pattern that increases the depth of focus. A component of the lithography system can then be configured based on the modified optical spectrum and the modified mask pattern 710 that increases the depth of focus. The component can include, for example, any combination of the mask, the light source, the pupil, or other components of the lithography system.

FIG. 15 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN.

For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

FIG. 16 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The embodiments may further be described using the following clauses:

1. A method of optimizing a method for imaging a feature on a substrate using a photolithography system, the method comprising:

obtaining an optical spectrum of a light beam for the imaging, wherein the light beam includes pulses having a plurality of different wavelengths; and narrowing the optical spectrum of the pulses of the light beam for the imaging to improve a quality metric of the imaging.

2. A method as in clause 1, further comprising:
obtaining a design for a patterning device configured to produce the feature on the substrate;
obtaining a light source design for the imaging; and
iteratively varying, concurrently, the optical spectrum of the light beam, the mask design, and the light source design to provide an optimized optical spectrum, an optimized mask design, and an optimized light source design.

3. A method as in any of the foregoing clauses, wherein a bandwidth of each pulse is between 50 fm and 275 fm.

4. A method as in any of the foregoing clauses, wherein the light beam is generated in a laser having a nominal bandwidth of 300 fm and wherein a line narrowing module of the laser is adjusted to produce the bandwidth of 50 fm to 275 fm.

5. A method as in any of the foregoing clauses, wherein the method comprises selecting the bandwidth to produce an improvement in a quality metric of the imaging process.

6. A method as in clause 5, wherein the quality metric is contrast.

7. A method as in clause 5, wherein the quality metric is image log slope or normalized image log slope.

8. A method as in clause 5, wherein the quality metric is exposure latitude.

9. A method as in any of the foregoing clauses, further comprising optimizing a light source design and/or a mask design based at least in part on the bandwidth of the pulses.

10. A method as in clause 9, wherein the optimizing comprises iteratively varying, concurrently, an optical spectrum of the light beam, the mask design, and the light source design to provide an optimized optical spectrum, an optimized mask design, and an optimized light source design.

11. A method as in any of the foregoing clauses, further comprising, selecting a difference between first and second wavelengths in accordance with a selected depth of focus.

12. A method as in any of the foregoing clauses, further comprising, imaging the feature on the substrate.

13. A method of imaging a feature on a substrate using a photolithography system, the method comprising:
directing a pulsed light beam along a direction of propagation toward a patterning device, the pulsed light beam comprising a plurality of pulses of light;
patterning a set of the pulses of light in the pulsed light beam with the patterning device to produce a patterned beam of light;
directing the patterned beam of light toward a substrate during a single exposure pass;
generating, during the single exposure pass, at least a first aerial image and a second aerial image on the substrate, the first aerial image being at a first plane on the substrate and the second aerial image being at a second plane on the substrate, the first plane and the second plane being spatially distinct from each other and separated from each other by a separation distance along the direction of propagation; and
forming the three-dimensional semiconductor component based on an interaction between light in the first aerial image and a material in a first portion of the substrate and an interaction between light in the second aerial image and a material in a second portion of the substrate, wherein at least one of the pulses in the set of pulses has a first wavelength and at least one of the other pulses in the set of pulses has a second wavelength that is different from the first wavelength, such that the separation distance is formed during the single exposure pass based on the difference between the first wavelength and the second wavelength and wherein a bandwidth of the set of pulses is narrowed.

14. A photolithographic system, comprising:
a light source configured and arranged to produce light pulses having a plurality of different wavelengths; and
a bandwidth-narrowing module configured and arranged to narrow a bandwidth of the light pulses.

15. A photolithographic system as in clause 14, further comprising:
a substrate table configured to hold a substrate; and
a projection system configured to project a patterned radiation beam comprising the light pulses onto a target region of the substrate so as to form an image on the substrate.

16. A photolithographic system as in clause 15, wherein the system is further configured and arranged to generate, during a single exposure pass, at least a first aerial image and a second aerial image on the substrate, the first aerial image being at a first plane on the substrate and the second aerial image being at a second plane on the wafer, the first plane and the second plane being spatially distinct from each other and separated from each other by a separation distance along a direction of propagation of the patterned radiation beam; and
forming a semiconductor component based on an interaction between light in the first aerial image and a material in a first portion of the substrate and an interaction between light in the second aerial image and a material in a second portion of the substrate, wherein
at least one of the pulses in the set of pulses has a first wavelength and at least one of the other pulses in the set of pulses has a second wavelength that is different from the first wavelength, such that the separation distance is formed during the single exposure pass based on the difference between the first wavelength and the second wavelength and wherein a bandwidth of the set of pulses is narrowed.

17. A photolithographic system as in any of clauses 14-16 further comprising a line narrowing module configured and arranged to adjust a bandwidth of the light pulses.

18. A photolithographic apparatus as in any of clauses 14-17 wherein the line narrowing module of the laser is adjusted to produce a bandwidth of 50 fm to 275 fm.

19. A computer program product comprising a non-transitory computer readable medium having machine executable instructions recorded thereon, the instructions when executed implementing the method of any of clauses 1-13.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for optimizing a process for illuminating a patterning device with an illumination radiation beam to image a feature on a substrate using a photolithography system, the method comprising:
   obtaining an optical spectrum of the radiation beam for the illumination of the patterning device for imaging, wherein the radiation beam includes pulses having a plurality of different wavelengths;
   selecting a difference in values between first and second wavelengths of the plurality of different wavelengths of the radiation beam to illuminate the patterning device to increase a depth of focus; and
   narrowing the optical spectrum associated with the first and/or second wavelength respectively of the pulses of the radiation beam to illuminate the patterning device to improve a quality metric of the imaging.

2. The method of claim 1, further comprising:
   obtaining a design for the patterning device configured to produce the feature on the substrate;
   obtaining a radiation illumination design for the imaging; and
   iteratively varying, concurrently, the optical spectrum of the radiation beam, the patterning device design, and the radiation illumination design to provide an optimized optical spectrum, an optimized patterning device design, and an optimized radiation illumination design.

3. The method of claim 1, wherein a bandwidth of each pulse is between 50 fm and 275 fm.

4. The method of claim 3, wherein the radiation beam is generated in a laser having a nominal bandwidth of 300 fm and wherein a line narrowing module of the laser is adjusted to produce the bandwidth of 50 fm to 275 fm.

5. The method of claim 1, comprising selecting the bandwidth to produce an improvement in a quality metric of the imaging process.

6. The method of claim 1, wherein the quality metric is contrast.

7. The method of claim 1, wherein the quality metric is image log slope or normalized image log slope.

8. The method of claim 1, wherein the quality metric is exposure latitude.

9. The method of claim 1, further comprising optimizing a radiation illumination design and/or a patterning device design based at least in part on a bandwidth of the pulses.

10. The method of claim 9, wherein the optimizing comprises iteratively varying, concurrently, an optical spectrum of the radiation beam, the patterning device design, and the radiation illumination design to provide an optimized optical spectrum, an optimized patterning device design, and an optimized radiation illumination design.

11. The method of claim 1, further comprising imaging the feature on the substrate.

12. The method of claim 1, further comprising:
   generating, during a single exposure pass, at least a first aerial image and a second aerial image on the substrate, the first aerial image being at a first plane on the substrate and the second aerial image being at a second plane on the substrate, the first plane and the second plane being spatially distinct from each other and separated from each other by a separation distance along the direction of propagation; and
   forming a three-dimensional semiconductor component based on an interaction between radiation in the first aerial image and a material in a first portion of the substrate and an interaction between radiation in the second aerial image and a material in a second portion of the substrate.

13. A computer program product comprising a non-transitory computer-readable medium having executable instructions therein, the instructions, when executed by a computer system, configured to cause the computer system to at least:
   obtain an optical spectrum of a radiation beam for illuminating a patterning device to image a feature on a substrate using a photolithography system, wherein the radiation beam includes pulses having a plurality of different wavelengths;
   select a difference in values between first and second wavelengths of the plurality of different wavelengths of the radiation beam to illuminate the patterning device to increase a depth of focus; and
   narrow the optical spectrum associated with the first and/or second wavelength respectively of the pulses of the radiation beam to illuminate the patterning device to improve a quality metric of the imaging.

14. The computer program product of claim 13, wherein a bandwidth of each pulse is between 50 fm and 275 fm.

15. The computer program product of claim 14, wherein the radiation beam is generated in a laser having a nominal bandwidth of 300 fm and wherein the instructions are configured to generate data to adjust a line narrowing module of the laser to produce the bandwidth of 50 fm to 275 fm.

16. The computer program product of claim 13, wherein the quality metric is contrast, image log slope, normalized image log slope or exposure latitude.

17. The computer program product of claim 13, wherein the instructions are further configured to cause the computer system to:
   obtain a design for a patterning device configured to produce the feature on the substrate;
   obtain a radiation illumination design for the imaging; and
   iteratively vary, concurrently, the optical spectrum of the radiation beam, the patterning device design, and the radiation illumination design to provide an optimized optical spectrum, an optimized patterning device design, and an optimized radiation illumination design.

18. The computer program product of claim 13, wherein the instructions are further configured to cause the computer system to optimize a radiation illumination design and/or a patterning device design based at least in part on a bandwidth of the pulses.

19. The computer program product of claim 13, wherein the instructions configured to cause the computer system to optimize the radiation illumination design and/or the patterning device design are further configured to cause the computer system to iteratively vary, concurrently, an optical spectrum of the radiation beam, the patterning device design, and the radiation illumination design to provide an optimized optical spectrum, an optimized patterning device design, and an optimized radiation illumination design.

20. The computer program product of claim 13, wherein the quality metric is contrast, image log slope or normalized image log slope, or exposure latitude.

* * * * *